(12) United States Patent
Kanda et al.

(10) Patent No.: US 11,111,572 B2
(45) Date of Patent: Sep. 7, 2021

(54) VAPOR DEPOSITION MASK

(71) Applicant: Japan Display Inc., Tokyo (JP)

(72) Inventors: Noriyoshi Kanda, Tokyo (JP); Takeshi Ookawara, Tokyo (JP); Mitsugu Tamekawa, Tokyo (JP)

(73) Assignee: Japan Display Inc., Tokyo (JP)

( * ) Notice: Subject to any disclaimer, the term of this patent is extended or adjusted under 35 U.S.C. 154(b) by 82 days.

(21) Appl. No.: 16/693,454

(22) Filed: Nov. 25, 2019

(65) Prior Publication Data

US 2020/0095668 A1 Mar. 26, 2020

Related U.S. Application Data

(63) Continuation of application No. PCT/JP2018/013198, filed on Mar. 29, 2018.

(30) Foreign Application Priority Data

Jun. 28, 2017 (JP) .............................. JP2017-126165

(51) Int. Cl.
*C23C 14/02* (2006.01)
*C23C 14/04* (2006.01)
*H01L 51/00* (2006.01)

(52) U.S. Cl.
CPC ........ *C23C 14/042* (2013.01); *H01L 51/0011* (2013.01)

(58) Field of Classification Search
CPC .................... C23C 14/042; H01L 51/0011
See application file for complete search history.

(56) References Cited

U.S. PATENT DOCUMENTS

| 2003/0012981 A1* | 1/2003 | Yamada ................. C23C 14/042 428/690 |
| 2005/0115503 A1* | 6/2005 | Hagiwara ............... C23C 14/12 118/721 |
| 2008/0289754 A1 | 11/2008 | Sone et al. |
| 2010/0080915 A1* | 4/2010 | Masuda ................. C23C 14/042 427/282 |

(Continued)

FOREIGN PATENT DOCUMENTS

| JP | 2006-152396 A | 6/2006 |
| JP | 2006-241547 A | 9/2006 |
| JP | 2009-221535 A | 10/2009 |

OTHER PUBLICATIONS

English Translation of the Written Opinion of the International Searching Authority dated Jun. 5, 2018 for the PCT application No. PCT/JP2018/013198.

(Continued)

*Primary Examiner* — Keath T Chen
(74) *Attorney, Agent, or Firm* — Michael Best & Friedrich LLP

(57) ABSTRACT

A vapor deposition mask includes a frame and a metal film supported by the frame, wherein the metal film includes a mask region arranged with a plurality of pixel opening parts corresponding to a display region of a display device, and an alignment region arranged in a periphery of the mask region, the alignment region includes a first opening part and a plurality of second opening parts arranged in a periphery of the first opening part, and a maximum width of the second opening part is smaller than a maximum width of the first opening part.

14 Claims, 6 Drawing Sheets

(56) References Cited

U.S. PATENT DOCUMENTS

| | | | |
|---|---|---|---|
| 2011/0048323 A1* | 3/2011 | Kondo | C23C 14/042 118/500 |
| 2011/0115057 A1* | 5/2011 | Harn | G03F 9/7084 257/620 |
| 2016/0043319 A1* | 2/2016 | White | G02B 26/02 359/230 |
| 2018/0065162 A1 | 3/2018 | Mikami et al. | |

OTHER PUBLICATIONS

Chinese Office Action dated Mar. 22, 2021 issued for Chinese Application No. 201880039459.9, with English machine translation.

International Search Report dated Jun. 5, 2018 for the corresponding PCT application No. PCT/JP2018/013198, with English translation.

Written Opinion of the International Searching Authority dated Jun. 5, 2018 for the corresponding PCT application No. PCT/JP2018/013198.

Japanese Office Action dated Jul. 13, 2021, issued in Japanese Application No. 2017-126165, with English machine translation.

\* cited by examiner

VAPOR DEPOSITION MASK

CROSS REFERENCE TO RELATED APPLICATIONS

This application is based upon and claims the benefit of priority from the prior Japanese Patent Application No. 2017-126165, filed on Jun. 28, 2017, and PCT Application No. PCT/JP2018/013198 filed on Mar. 29, 2018, the entire contents of which are incorporated herein by reference.

FIELD

The present invention is related to a vapor deposition mask. In particular, the present invention is related to a vapor deposition mask arranged with a plurality of opening parts in a metal film formed by electroforming.

BACKGROUND

Conventionally, in a manufacturing process of a display device using an organic EL (electroluminescence) material (referred to below as "organic EL display device"), a vapor deposition method is used as a formation technique of a thin film formed by an organic EL material. In the case where a thin film formed by an organic EL material is formed using a vapor deposition method, a vapor deposition mask (also called a metal mask) formed by a metal film having a plurality of fine opening parts is used. Specifically, the organic EL material can be selectively applied to a plurality of pixels by using a vapor deposition mask in which a plurality of openings are formed corresponding to the plurality of pixels (that is, a region where an organic EL material is vapor deposited).

The vapor deposition mask can be manufactured by etching a metal plate or by using electroforming. In particular, a vapor deposition mask which is manufactured using electroforming is excellent in dimensional accuracy, and is suitable for forming a highly accurate thin film. As a result, for example, in Japanese Laid Open Patent Publication No. 2006-152396, a vapor deposition mask using electroforming is used for vapor deposition of an organic EL material which forms a light emitting layer or the like of an organic EL display device.

SUMMARY

A vapor deposition mask in one embodiment of the present invention includes a frame and a metal film supported by the frame, wherein the metal film includes a first opening part and a plurality of second opening parts arranged in the periphery of the first opening part, and a diameter of the second opening part is smaller than a diameter of the first opening part.

DESCRIPTION OF EMBODIMENTS

Figure 1:
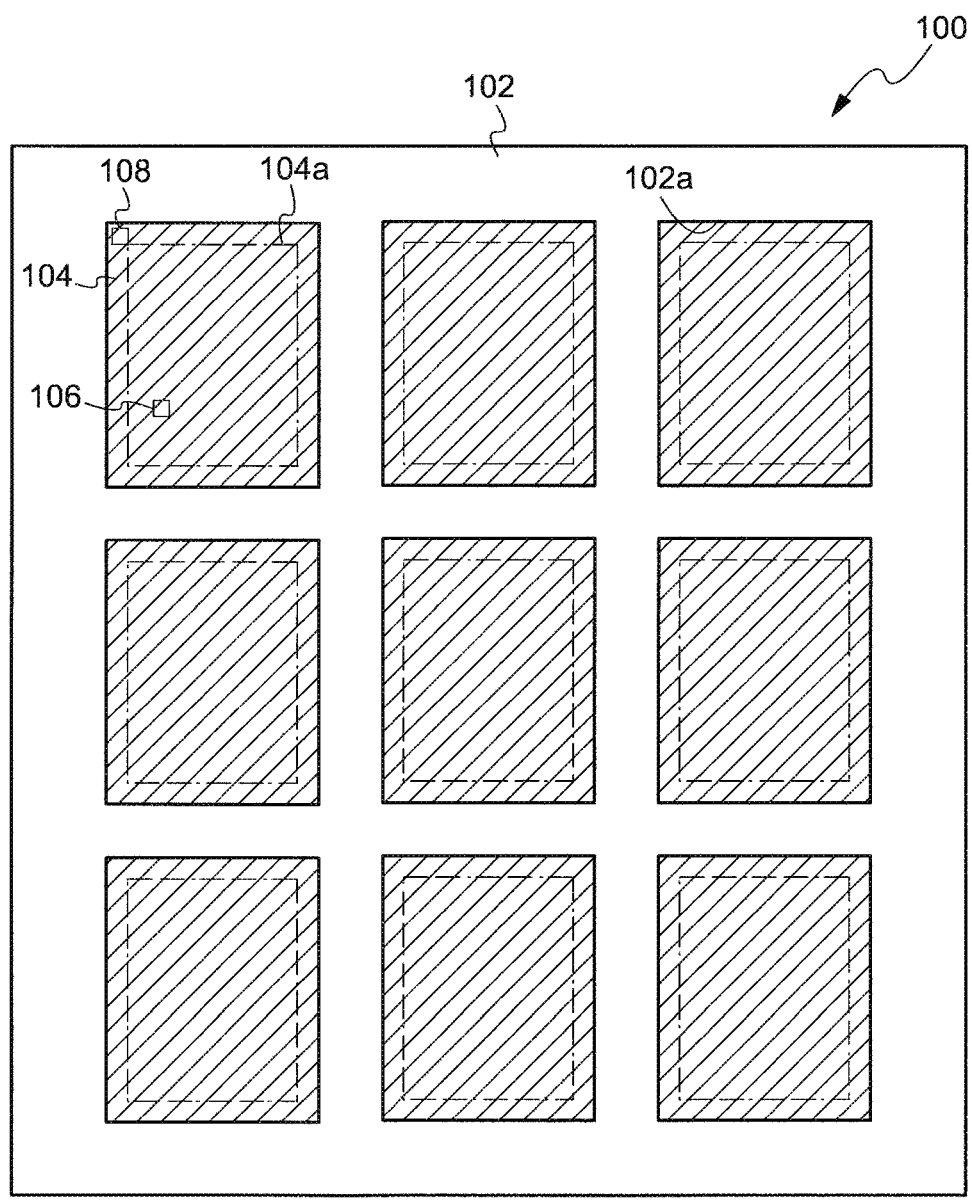
FIG. 1 is a planar diagram showing a structure of a vapor deposition mask of a first embodiment.

When vapor deposition using a vapor deposition mask is carried out, it is necessary to match the position of the vapor deposition mask and the position of an array substrate (substrate on which a plurality of pixel circuits is formed) with a high accuracy. This type of alignment is usually performed using an alignment mark. An alignment mark is formed on both the vapor deposition mask and the array substrate. For example, an opening is formed as an alignment mark in the vapor deposition mask, and an alignment mark having the same shape as the vapor deposition mask is formed in advance in the array substrate. Next, the vapor deposition mask and the array substrate are aligned by matching the outline of an opening part of the vapor deposition mask with the outline of the alignment mark of the array substrate.

In this case, although an opening part is formed as an alignment mark in a vapor deposition mask which is manufactured using electroforming, since the vapor deposition which is manufactured using electroforming is formed by a metal film, it is very thin. Therefore, stress concentrates in the vicinity of the opening part formed as the alignment mark and the metal film may sometimes become warped.

The alignment of the alignment mark on the vapor deposition mask and the alignment mark on the array substrate is carried out using an autofocus mechanism of a camera. At this time, if the vicinity of the alignment mark is warped, a problem arises whereby it is difficult to carry out focusing using the autofocus mechanism, and alignment using the alignment mark can no longer be carried out.

This present invention has been made in view of the problem described above, and aims to relieve stress which produced in the vicinity of an alignment mark arranged in a metal film which forms a vapor deposition mask.

The embodiments of the present invention are explained below while referring to the diagrams. However, the present invention can be implemented in a variety of modes without departing from the gist of the invention, and should not be interpreted as being limited to the described details of the embodiments exemplified herein.

In addition, although the drawings may be schematically represented with respect to the width, thickness, shape and the like of each part as compared with their actual embodiment in order to make the explanation clearer, they are merely examples and do not limit an interpretation of the present invention. In addition, in the present specification and each drawing, elements which have the same functions as those described with reference to previous drawings may be denoted by the same reference numerals and repeated explanations may be omitted.

First Embodiment

<Vapor Deposition Mask Structure>

FIG. 1 is a planar diagram showing a structure of a vapor deposition mask 100 of the first embodiment. The vapor deposition mask 100 includes a frame 102 formed from a metal member such as Invar, and a plurality of metal films 104 held in a plurality of opening parts 102a arranged in the frame 102.

The plurality of metal films 104 are each arranged corresponding to individual organic EL display devices and function as masks which block a vapor deposition material. The metal film 104 is manufactured by electroforming, and can be manufactured, for example, by a plating technique using a metal material such as nickel, a nickel-cobalt alloy, an iron-nickel alloy or copper. The film thickness of the metal film may be in a range of 5 to 20 μm, for example.

The metal film 104 includes a mask region 104a. The mask region 104a is a region corresponding to a display region of the organic EL display device to be vapor deposited. The mask region 104a includes a plurality of pixel opening parts at positions corresponding to respective pixels arranged in the display region of the organic EL display device. The plurality of pixel opening parts are for selectively vapor depositing an organic EL material on each pixel. Here, FIG. 2 shows a state in which a part of the inner side of the mask region 104a (region surrounded by the frame line 106) is enlarged.

Figure 2:
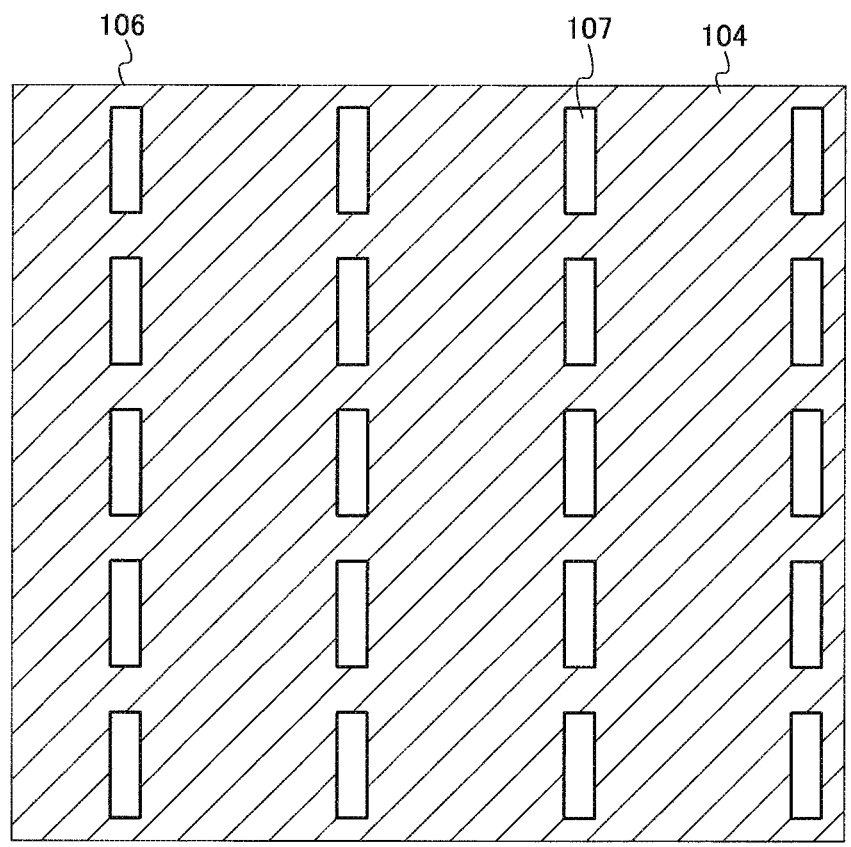
FIG. 2 is a planar diagram showing an expanded view of a part of a mask region in a vapor deposition mask of a first embodiment.

FIG. 2 is a planar diagram showing an expanded view of a part of an inner side of a mask region 104a in a vapor deposition mask 100 of the first embodiment. As is shown in FIG. 2, a plurality of pixel opening parts 107 are arranged in the metal film 104 in the region surrounded by the frame line 106.

The pixel opening parts 107 are arranged corresponding to the positions of individual pixels (pixels of the organic EL display device). Furthermore, the metal film 104 shown in FIG. 2 includes a pixel opening part 107 corresponding to the position of a sub-pixel which emits red, green, or blue light. In the case where it corresponds to sub-pixels which emit light of other colors, the positions of the pixel opening parts 107 are shifted by one or two columns.

In addition, in FIG. 1, an alignment mark is arranged in a region on the outer side of the mask region 104a in the metal film 104. The alignment mark is for aligning the position of the vapor deposition mask 100 and a mother glass (not shown in the diagram) which is formed with a plurality of organic EL display devices. Here, FIG. 3 shows a state in which a part of the outer side of the mask region 104a (region surrounded by the frame line 108) is enlarged.

Figure 3:
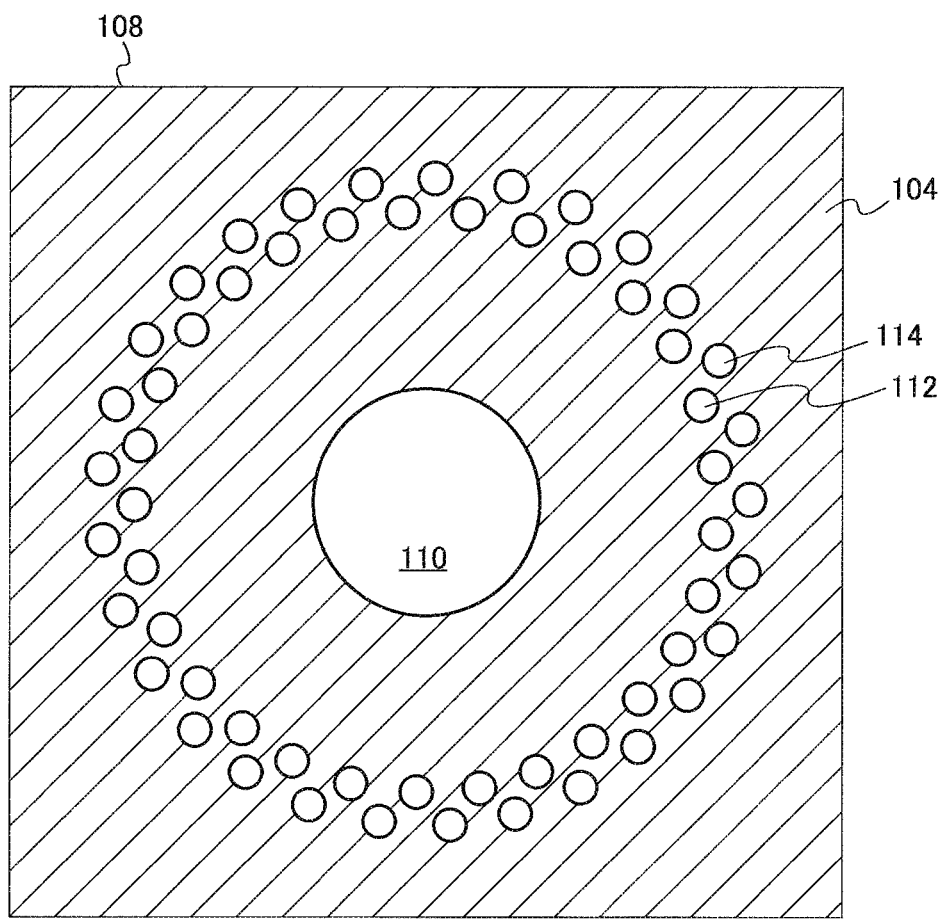
FIG. 3 is a planar diagram showing an expanded view of an exterior side of a mask region in a vapor deposition mask of a first embodiment.

FIG. 3 is a planar diagram showing an expanded view of a part of an exterior side of the mask region 104a in the vapor deposition mask 100 of the first embodiment. As is shown in FIG. 3, a first opening part 110 is provided in the metal film 104 in the region surrounded by the frame line 108. In the present embodiment, the first opening part 110 functions as an alignment mark.

Although the case where the outline of the first opening part 110 is circular is illustrated in the present embodiment, the present invention is not limited to this shape, and it may be a polygon, a rectangle or an ellipse and the like. However, in order to suppress as much as possible stress generated at the edge of the first opening part 110, the outline of the first opening 110 is preferred to be circular.

Furthermore, in the present embodiment, a plurality of second opening parts 112 and third opening parts 114 are arranged in the periphery of the first opening part 110. Specifically, a plurality of second opening parts 112 and a plurality of third opening parts 114 are annularly arranged along the outline of the first opening part 110.

The plurality of third opening parts 114 are arranged further to the outer side than the second opening parts 112 with respect to the first opening part 110. At this time, as is shown in FIG. 3, the plurality of second opening parts 112 and the plurality of third opening parts 114 are alternately arranged clockwise or counterclockwise along the outline of the first opening part 110.

The plurality of second opening parts 112 and third opening parts 114 function as stress relieving parts which relieve stress generated in the periphery of the first opening part 110 respectively.

Furthermore, in the present embodiment, since the outline of the first opening part 110 is circular, the arrangement of the plurality of second opening parts 112 and the third opening parts 114 is annular. However, for example, if the outline of the first opening part 110 is rectangular, then the plurality of second opening parts 112 and third opening parts 114 may be arranged along the rectangle. However, this is only an example, and the plurality of second opening parts 112 and the plurality of third opening parts 114 may be arranged so as not to follow the outline of the first opening part 110.

Figure 4:
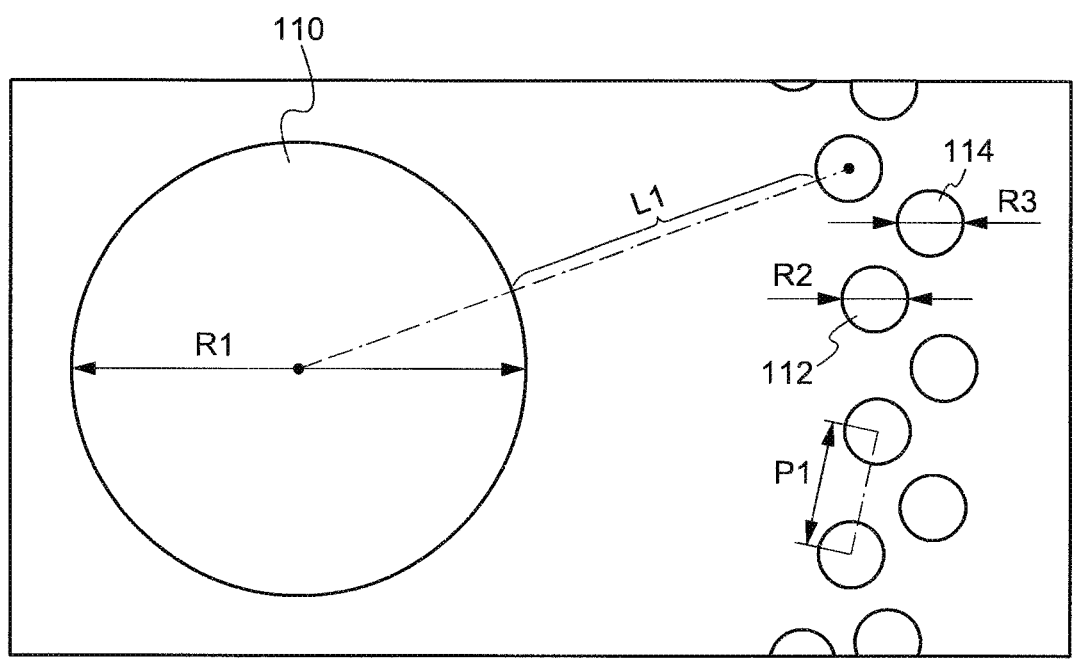
FIG. 4 is a planar diagram showing an expanded view of a part of a first opening part, a plurality of second opening parts and a third opening part in a mask region in a vapor deposition mask of a first embodiment.

FIG. 4 is a planar diagram showing an expanded view of a part of the first opening part 110, the plurality of second opening parts 112, and the plurality of third opening parts 114 in the vapor deposition mask 100 of the first embodiment. As is shown in FIG. 4, when the diameter of the first opening part 110 is R1, the diameter of the second opening part 112 is R2, and the diameter of the third opening part 114 is R3, then R2 and R3 are smaller than R1. Specifically, it is preferred that R2 and R3 have a diameter which is equal to or less than half of R1.

For example, R1 can be set to 0.5 mm or more and 1.5 mm or less (preferably 0.8 mm or more and 1.2 mm or less), and R2 and R3 can be set to 150 μm or more and 250 μm or less (preferably 180 μm or more and 220 μm or less). In the present embodiment, R1 is set to 1.0 mm, and R2 and R3 are set to 200 μm. Furthermore, although R2 and R3 have the same length in the present embodiment, the present invention is not limited to this, and R2 and R3 may also have different lengths.

In the present embodiment, although the expression "diameter" is used to indicate size since the first opening part 110, the second opening part 112 and the third opening part 114 are circular, this is only an example of an index indicating size. In the present specification, the expression "maximum width" is used as an index to indicate the size of each opening part. Here, the "maximum width" is the maximum width (maximum distance) when two points on the outline of an opening are connected by a straight line. That is, in the case when the first opening part 110, second opening part 112 and third opening part 114 are circular, the maximum width is equal to the diameter. According to this example, even when the first opening part 110, the second opening part 112 and the third opening part 114 have a diagram in which the distance from the center to the outline changes such as in a rectangle, a polygon, or an ellipse, it is possible to perform a relative comparison if the maximum width is used as an index of the size.

In addition, as is shown in FIG. 4, the plurality of second opening parts 112 are arranged separated from the edge of the first opening part 110 by a predetermined distance L1. The predetermined distance L1 is arranged so that an autofocus mechanism does not misrecognize the plurality of second opening parts 112 and the plurality of third opening parts 114 arranged in the periphery of the first opening part 110 as the first opening part 110 during an alignment operation. Although the predetermined distance L1 is preferred to be a distance (1.0 mm or more in this embodiment) which is that is equal to or larger than the diameter (that is, the maximum width) of the first opening part 110, there is no particular limit as long as misrecognition described above is avoided.

In the case when the distance between adjacent second opening parts 112 (specifically, the distance between the centers of adjacent second opening parts 112) among the plurality of second opening parts 112 is given as P1, then P1 may be set in a range of 300 µm or more and 500 µm or less (preferably 350 µm or more and 450 µm or less). In addition, the distance between adjacent opening parts among the plurality of third opening parts 114 may also be set in the same range.

As is described above, in the present embodiment, in the vapor deposition mask 100 which uses the metal film 104 as a vapor deposition mask, the metal film 104 is arrange with the first opening part 110 as an alignment mark. At this time, a plurality of second opening parts 112 and a plurality of third opening parts 114 are arranged with a smaller diameter than the first opening part 110 so as to surround the periphery of the first opening part 110, and stress produced in the vicinity of the first opening 110 is relieved.

The stress which is produced in the metal film 104 accumulates as it approaches the first opening part 110 from the vicinity of the boundary between the frame 102 and the metal film 104 in FIG. 1. Conventionally, since an opening corresponding to the second opening part 112 and the third opening part 114 shown in FIG. 3 does not exist, there was a problem whereby the edge of the first opening part 110 became warped due to stress. In particular, in the case when the diameter of the first opening part 110 is 0.5 mm or more, the problem of warpage became significant.

However, in the present embodiment, by arranging a plurality of second opening parts 112 and a plurality of third opening parts 114 in the periphery of the first opening part 110 as is shown in FIG. 3, the stress which gradually accumulates from the boundary between the frame 102 and the metal film 104 is relieved in a region where the plurality of second opening parts 112 and the plurality of third openings arts 114 are arranged, and is not transmitted to the edge of the first opening part 110. That is, a problem of bending in a perpendicular direction to the metal film 104 is eliminated and the problem whereby the edge of the first opening part 110 warps does not occur. As a result, according to the present embodiment, it is possible to obtain an accurate alignment using the first opening part 110 as an alignment mark. In particular, the present embodiment is effective in the case when the diameter of the first opening part 110 is 0.5 mm or more.

Furthermore, as in the present embodiment, the first opening part 110 is doubly surrounded by a plurality of second opening parts 112 and a plurality of third opening parts 114, and it is preferred that the plurality of second opening parts 112 and the plurality of third opening parts alternately arranged in a clockwise or counterclockwise direction along the outline of the first opening part 110. In the case of such a structure, since a path through which stress is transmitted toward the first opening part 110 can be efficiently blocked by the plurality of second opening parts 112 and the plurality of third opening parts 114, the effect of stress relief is further enhanced.

Furthermore, although an example of a structure in which a plurality of second opening parts 112 and a plurality of third opening parts 114 are arranged, and the periphery of the first opening 110 is doubly surrounded by a plurality of opening parts is shown in the present embodiment, a structure in which only one of the second opening part 112 and the third opening part 114 is arranged may be adopted. In addition, it is also possible to adopt a structure in which the periphery of the first opening part 110 is triply surrounded with a plurality of opening parts.

Second Embodiment

In the second embodiment, an example is explained in which the shape of an opening part formed in the metal film 104 is different from the first embodiment. Furthermore, in the present embodiment, an explanation is given while paying attention to the difference in structure from the vapor deposition mask 100 of the first embodiment, and an explanation of the same components which may be denoted by the same reference numerals may be omitted.

Figure 5:
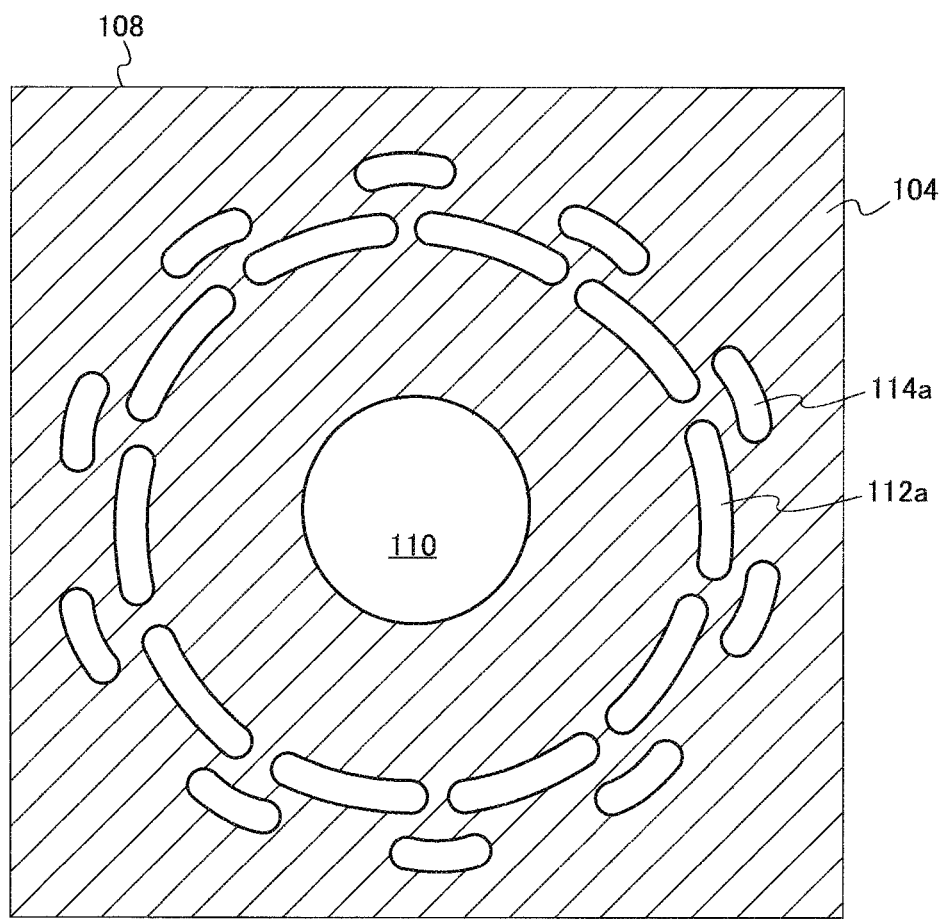
FIG. 5 is a planar diagram showing an expanded view of a vicinity of a first opening part which functions as an alignment mask in a second embodiment.

FIG. 5 is a planar diagram showing an expanded view of the vicinity of the first opening part 110 which functions as an alignment mark in the second embodiment. In the present embodiment, a plurality of second opening parts 112a and a plurality of third opening parts 114a having a shape along an arc are arranged in the periphery of the first opening part 110.

At this time, the plurality of third opening parts 114a are arranged at positions corresponding to gaps between adjacent second opening parts 112a. That is, the third opening part 114a is arranged at a position which overlaps a gap between adjacent second opening parts 112a when viewed from the first opening part 110. In this way, the metal film 104 of the present embodiment has a structure in which a stress transmission path towards the first opening part 110 is blocked by the second opening part 112a and the third opening part 114a.

By adopting this structure, in the present embodiment, stress which gradually accumulates from the boundary between the frame 102 and the metal film 104 is reset in a region where the second opening part 112a and the third opening part 114a are arranged, and is not transmitted to the edge of the first opening part 110. Therefore, since the problem whereby the edge of the first opening part 110 warps does not occur, it is possible to achieve accurate alignment using the first opening part 110 as an alignment mark.

Third Embodiment

In the third embodiment, an example is explained in which the shape of an opening formed in the metal film 104 is different from the first embodiment. Furthermore, in the present embodiment, an explanation is given while paying attention to the difference in structure from the vapor deposition mask 100 of the first embodiment, and an explanation of the same components which may be denoted by the same reference numerals may be omitted.

Figure 6:
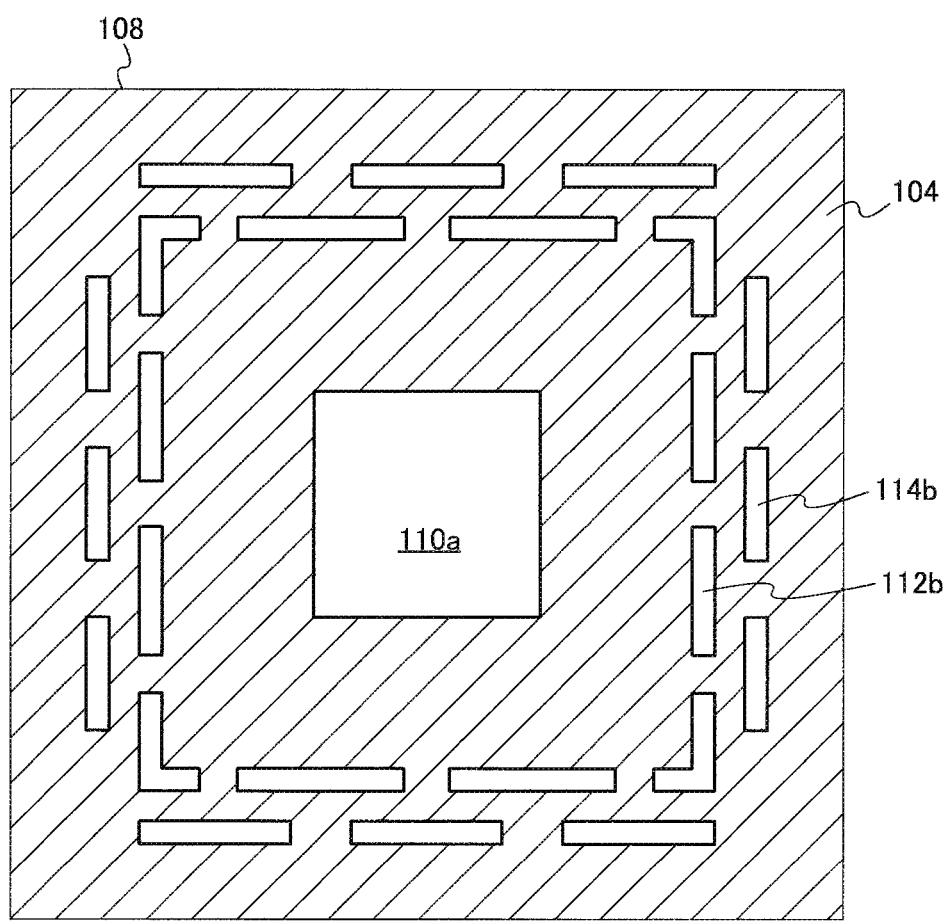
FIG. 6 is a planar diagram showing an expanded view of a vicinity of a first opening part which functions as an alignment mask in a third embodiment.

FIG. 6 is a planar diagram showing an expanded view of the vicinity of the first opening part 110 which functions as an alignment mark in the third embodiment. In the present embodiment, the outline of the first opening part 110a is rectangular, and a plurality of second opening parts 112b and a plurality of third opening parts 114b are arranged in the periphery of the first opening part 110 along each side. The plurality of second opening parts 112b include a plurality of rod-shaped opening parts. Although the second opening part 112b and the third opening part 114b are rectangular or L-shaped in the present embodiment, they may also be square.

The third opening part 114b is arranged at a position which corresponds to a gap between adjacent second opening parts 112b. That is, the third opening part 114b is arranged at a position which overlaps a gap between adjacent second opening parts 112b when viewed from the first opening part 110a. In this way, the metal film 104 of the present embodiment has a structure in which a stress transmission path towards the first opening part 110a is blocked by the second opening part 112b and the third opening part 114b.

By adopting this structure, in the present embodiment, stress which gradually accumulates from the boundary between the frame 102 and the metal film 104 is reset in a region where the second opening part 112b and the third opening part 114b are arranged, and is not transmitted to the edge of the first opening part 110a. Therefore, since the problem whereby the edge of the first opening part 110a warps does not occur, it is possible to achieve accurate alignment using the first opening part 110a as an alignment mark.

Each embodiment described above as embodiments of the present invention can be implemented in combination as appropriate as long as they do not contradict each other. In addition, those skilled in the art could appropriately add, delete or change the design of the constituent elements based on the display device of each embodiment, or add, omit or change conditions as long as it does not depart from the concept of the present invention and such changes are included within the scope of the present invention.

Even if other actions and effects different from the actions and effects brought about by the aspects of each embodiment described above are obvious from the description of the present specification or those which could be easily predicted by those skilled in the art, such actions and effects are to be interpreted as being provided by the present invention.

What is claimed is:

1. A vapor deposition mask comprising:
   a frame; and
   a metal film supported by the frame,
   wherein
   the metal film includes a mask region corresponding to a display region of a display device and the mask region is arranged with a plurality of pixel opening parts, and an alignment region arranged in a periphery of the mask region,
   the alignment region includes a first opening part and a plurality of second opening parts arranged in a periphery of the first opening part,
   a maximum width of the second opening part is smaller than a maximum width of the first opening part,
   a plurality of third opening parts arranged further to the outer side than the plurality of second opening parts with respect to the first opening part, and
   the plurality of second opening parts and the plurality of third opening parts are alternately arranged in a clockwise or counterclockwise direction along an outline of the first opening part.

2. The vapor deposition mask according to claim 1, wherein the plurality of second opening parts is arranged along an outline of the first opening part.

3. The vapor deposition mask according to claim 1, wherein the plurality of third opening parts is arranged along an outline of the plurality of first opening parts.

4. The vapor deposition mask according to claim 1, wherein the plurality of second opening parts is arranged in a position separated by a larger distance than the maximum width of the first opening part from an edge of the first opening part.

5. The vapor deposition mask according to claim 1, wherein an outline of the first opening part is circular.

6. The vapor deposition mask according to claim 1, wherein a film thickness of the metal film is 5 μm to 20 μm.

7. The vapor deposition mask according to claim 1, wherein a maximum width of the first opening part is 0.5 mm or more.

8. A vapor deposition mask comprising:
   a frame; and
   a metal film supported by the frame,
   wherein
   the metal film includes a mask region corresponding to a display region of a display device and the mask region is arranged with a plurality of pixel opening parts, and an alignment region arranged in a periphery of the mask region,
   the alignment region includes a first opening part and a plurality of second opening parts arranged in a periphery of the first opening part,
   a maximum width of the second opening part is smaller than a maximum width of the first opening part, and
   the plurality of second opening parts is arranged in a position separated by a larger distance than the maximum width of the first opening part from an edge of the first opening part.

9. The vapor deposition mask according to claim 8, wherein the plurality of second opening parts is arranged along an outline of the first opening part.

10. The vapor deposition mask according to claim 8, further comprising:
    a plurality of third opening parts arranged further to the outer side than the plurality of second opening parts with respect to the first opening part.

11. The vapor deposition mask according to claim 10, wherein the plurality of third opening parts is arranged along an outline of the plurality of first opening parts.

12. The vapor deposition mask according to claim 8, wherein an outline of the first opening part is circular.

13. The vapor deposition mask according to claim 8, wherein a film thickness of the metal film is 5 μm to 20 μm.

14. The vapor deposition mask according to claim 8, wherein a maximum width of the first opening part is 0.5 mm or more.

* * * * *